United States Patent
Silver et al.

[11] Patent Number: 6,094,471
[45] Date of Patent: Jul. 25, 2000

[54] X-RAY DIAGNOSTIC SYSTEM

[75] Inventors: Eric H. Silver, Needham; Herbert W. Schnopper, Cambridge; Russel Ingram, Canton, all of Mass.

[73] Assignee: Smithsonian Astrophysical Observatory, Cambridge, Mass.

[21] Appl. No.: 09/064,476

[22] Filed: Apr. 22, 1998

[51] Int. Cl.$^7$ ........................................ G21K 1/06
[52] U.S. Cl. ...................... 378/84; 378/85; 378/87; 378/88; 378/45; 378/145
[58] Field of Search ............................ 378/84, 85, 87, 378/88, 45, 145

[56] References Cited

U.S. PATENT DOCUMENTS

| | | | |
|---|---|---|---|
| 4,525,853 | 6/1985 | Keem et al. | 378/84 |
| 5,497,008 | 3/1996 | Kumakhov | 250/505.1 |
| 5,812,631 | 9/1998 | Yan et al. | 378/85 |
| 5,912,940 | 6/1999 | O'Hara | 378/82 |

*Primary Examiner*—David P. Porta
*Assistant Examiner*—Pamela R. Hobden
*Attorney, Agent, or Firm*—Choate, Hall & Stewart

[57] ABSTRACT

X-ray diagnostic system. The system includes a source of x-rays which communicates with an x-ray beam concentrator spaced apart from the x-ray source and disposed for receiving x-rays from the x-ray source. An x-ray spectrometer is disposed for receiving x-rays from the concentrator. In a preferred embodiment, the concentrator is formed of a cylindrical spiral of a metal-coated plastic material having a surface for reflecting x-rays. In another embodiment, the concentrator includes a plurality of concentric nested cylinders of a metal-coated plastic material for reflecting x-rays. In yet another embodiment, the concentrator is a glass capillary bundle. The concentrator allows the spectrometer to be spaced away from the source of x-rays such as scanning electron microscope.

22 Claims, 13 Drawing Sheets

X-RAY DIAGNOSTIC SYSTEM

The government has rights in this invention under grant No. N00014-95-1-1248.

BACKGROUND OF THE INVENTION

This invention relates to x-ray diagnostic systems and more particularly to a system which concentrates x-rays from a source and delivers them to an x-ray spectrometer.

Most focusing x-ray optics take advantage of total reflection at glancing angles of incidence. Total reflection occurs only when the angle of incidence is less than a critical angle that depends upon the properties of the reflecting material and the x-ray energy. Although prior art designs may vary according to application, most such designs have used metal or glass substrates with coatings of nickel, gold or iridium at glancing angles ranging from 10 to 150 arc minutes. Double-reflection geometries of the Wolter-I or Kirkpatrick-Baez types have been developed to focus a parallel beam of x-rays. The Wolter-I configuration consists of confocal parabaloid-hyperboloid shells and has been used most often for x-ray telescopes designed for high angular resolution. This optic is axially compact, has a moderate field of view and, in some cases, a large number of telescopes can be nested to fill a substantial fraction of the available entrance aperture. An approximation to the Wolter-I design replaces the precisely figured optics with simple cones. Telescopes based upon this approximation have been developed for various astrophysical payloads. The Kirkpatrick-Baez geometry uses two parabolic surfaces for parallel-to-point focusing, and it has been adapted to point-to-point geometries for x-ray microscopes. Recently, optics based upon bundles of glass capillary tubes have emerged as a method for focusing x-rays. The x-rays undergo numerous reflections as they travel through the glass channels causing these optics to have lower efficiency than the double reflection systems referred to above.

Electron microscopes are widely used in many applications including in the semiconductor fabrication industry. When targets are irradiated with electrons, x-rays are generated as a side effect. The x-ray spectrum provides information about elements contained in the target so that x-rays are often detected for analysis. In the prior art, it is known to place a detector such as a lithium-drifted silicon or germanium detector very close to the target in a scanning electron microscope. Such detectors are typically mounted on the end of a cold finger cooled by thermal conduction by means of a quantity of liquid nitrogen which boils at 77 kelvin. Higher resolution can be achieved utilizing detectors cooled to approximately 0.1 kelvin and in this context it may be desirable to locate the detector outside of the SEM enclosure. However, because of the well known square law dependence of intensity on distance from a source of x-rays, as a detector is moved farther from the source, the intensity drops which degrades the performance of a spectrometer receiving the x-rays. It is also known to use monolithic polycapillary glass optics within an SEM enclosure to concentrate x-rays for subsequent analysis but not to use any such concentrator beyond the confines of the SEM enclosure.

SUMMARY OF THE INVENTION

In one aspect, the x-ray diagnostic system of the invention includes a source of x-rays and an x-ray beam concentrator spaced apart from the x-ray source and disposed for receiving x-rays from the x-ray source. An x-ray spectrometer is disposed for receiving x-rays from the concentrator. The source of x-rays may be a point source such as a sample volume excited by an electron beam in a scanning electron microscope or excited by a focused synchrotron beam, an ion beam or a laser. The point source of x-rays may also be a commercial x-ray tube or may be produced by a small volume of hot gas produced in a laboratory plasma machine which may be of the magnetically and/or electrostatically confined type. The plasma can also be inertially confined. The x-ray source may also be a commercial electron impact device or even be a distant x-ray emitting object in space.

In preferred embodiments, the point-to-point x-ray concentrator is a single reflection concentrator made from either a nest of cylindrical surfaces or a surface wound into the form of a cylindrical spiral. The point-to-point concentrator may be a multiple reflection concentrator made either from opposed sets of nested conical surfaces or surfaces wound into the form of conical spirals. In another embodiment, the point-to-point concentrator is a single glass capillary bundle. The single glass capillary bundle may be monolithic. In another embodiment, the point-to-point concentrator includes a point-to-parallel glass capillary bundle coupled to a parallel-to-point glass capillary bundle and coupling occurs through vacuum or in gas over a variable distance.

It is preferred that the spectrometer be an energy dispersive x-ray detector such as a microcalorimeter, lithium-drifted silicon detector, germanium detector, cadmium zinc telluride (CZT) detector, gas scintillation proportional counter or gas proportional counter.

The spectrometer may also be a wavelength dispersive x-ray spectrometer which may use at least one flat Bragg crystal or may utilize at least one Bragg crystal in the Johann configuration or von Hamos configuration.

In yet another aspect, the invention is an x-ray concentrator comprising a ribbon of material having a reflecting surface and formed into a spiral having a plurality of windings. This concentrator may be either a single or a multiple reflection concentrator. It is preferred that the ribbon material be plastic foil, aluminum foil or quartz ribbon. A suitable plastic foil is polyester, kapton, melinex, hostaphan, apilcal or mylar. A particularly preferred plastic is available from the Eastman Kodak Company under the designation ESTAR™. Suitable foil thicknesses range from 0.004 to 0.015 inches as required. It is preferred that the ribbon material be coated with a thin layer of metal, preferably a high Z metal such as nickel, gold or iridium. The metal coating may be multilayer. In a preferred embodiment, the spiral configuration is maintained by a support structure made of metal, plastic or a composite material. Suitable metals are aluminum, beryllium, stainless steel, titanium or tungsten.

In yet another aspect, the invention is an x-ray concentrator comprising a plurality of nested, concentric cylinders or cones made of a ribbon material having a reflecting surface. The nested cylinders or cones may be made of glass, aluminum foil, plastic foil, silicon or germanium. Suitable plastic material is the same as described above in conjunction with the spiral aspect of the invention. The plastic material would also be coated as described above in conjunction with the spiral configuration.

The concentrators of the invention may be located, for example, outside the enclosure of an SEM and receive x-rays through an x-ray permeable window or through an evacuated pipe with no window between the SEM and concentrator. The x-rays are concentrated or focused onto a spectrometer which may be located several meters from the target within the SEM. Because of the separation, spectrometers such as microcalorimeters cooled to on the order of 0.1 kelvin can be more conveniently utilized thereby giving much greater spectral resolution.

DESCRIPTION OF THE PREFERRED EMBODIMENT

Figure 1:
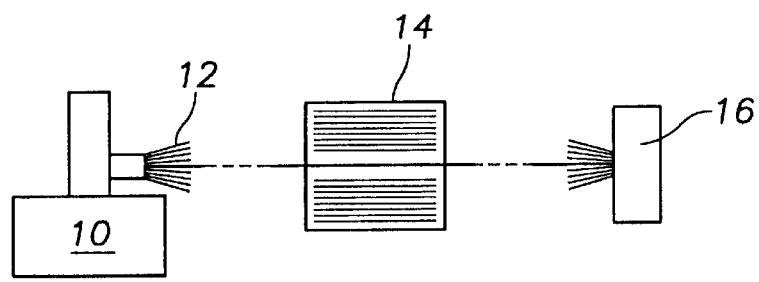
FIG. 1 is a schematic illustration of an embodiment of the invention employing single reflection cylindrical or cylindrical spiral foils.
Figure 2:
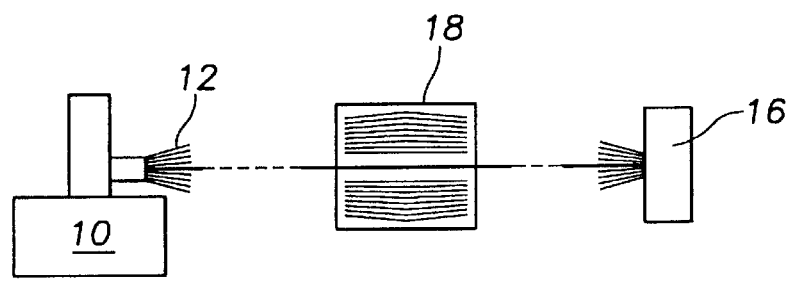
FIG. 2 is a schematic illustration of an embodiment of the invention employing double or multiple reflection conical or conical spiral foils.
Figure 3:
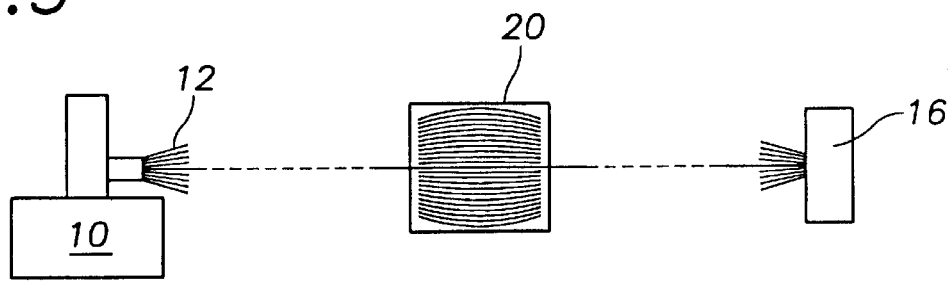
FIG. 3 is a schematic illustration of an embodiment of the invention utilizing a multiple reflection point-to-point capillary bundle.
Figure 4:
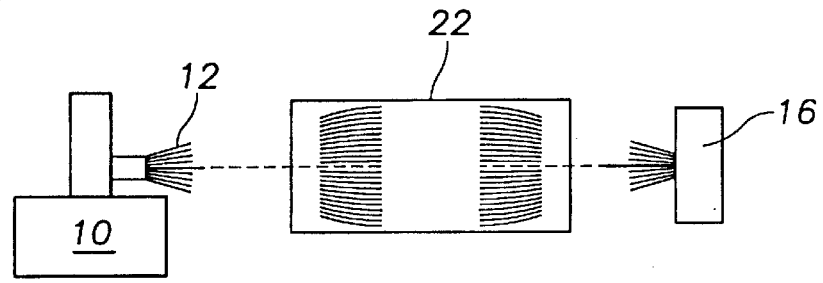
FIG. 4 is a schematic illustration of an embodiment of the invention employing a multiple reflection point-to-parallel and parallel-to-point capillary bundle. This figure is also a schematic illustration of an embodiment of the invention that employs a point-to-parallel single or multiple reflection conical or conical spiral concentrator followed by a single or multiple reflection parallel-to-point conical or conical spiral concentrator.

In applications where x-rays from a remote point source are being studied, the fall-off in photon flux with the square of the distance can seriously limit the sensitivity of the measurement. Two generic x-ray optic designs disclosed herein address the sensitivity problem. One design concept is based upon single or multiple reflection at grazing incidence from surfaces formed from nested cylindrical, conical, cylindrical spiral or conical spiral foils as shown in FIGS. 1 and 2. In these figures, a scanning electron microscope 10 generates a divergent beam of x-rays 12. The x-rays 12 impinge upon a single reflection cylindrical or cylindrical spiral foil concentrator 14 and are focused on a spectrometer 16. In FIG. 2 the diverging beam of x-rays 12 encounters a nested or multiple reflection conical or conical spiral foil concentrator 18 which similarly focuses the x-rays 12 on the spectrometer 16. A second design concept is shown in FIGS. 3 and 4 and takes advantage of multiple reflections in glass capillary bundles. In FIG. 3, the diverging beam of x-rays 12 passes through point-to-point capillary bundle 20 which focuses the x-rays 12 onto the spectrometer 16. In FIG. 4, multiple reflection point-to-parallel, parallel-to-point capillary bundles 22 similarly focused the beam 12 onto the spectrometer 16. FIG. 4 also represents a point-to-parallel single or multiple reflection conical or conical spiral concentrator followed by a single or multiple reflection parallel-to-point conical or conical spiral concentrator. Details of the embodiments shown in FIGS. 1–4 will be described hereinbelow and the performance from experiments are presented. Each of the x-ray optics embodiments shown in FIGS. 1–4 is compact and capable of providing a significant enhancement in the solid angle of collection. These embodiments are particularly adapted to laboratory astrophysics and x-ray microanalysis applications in which they can significantly improve coupling of a cryostat which contains a high resolution x-ray microcalorimeter to a plasma machine or the scanning electron microscope 10. It will be readily apparent to those skilled in the art that the technology disclosed herein is applicable to space-borne astrophysical applications. Because the concentrators 14, 18, 20 and 22 focus a diverging beam, acceptable intensities are presented at the spectrometer 16.

Figure 5:
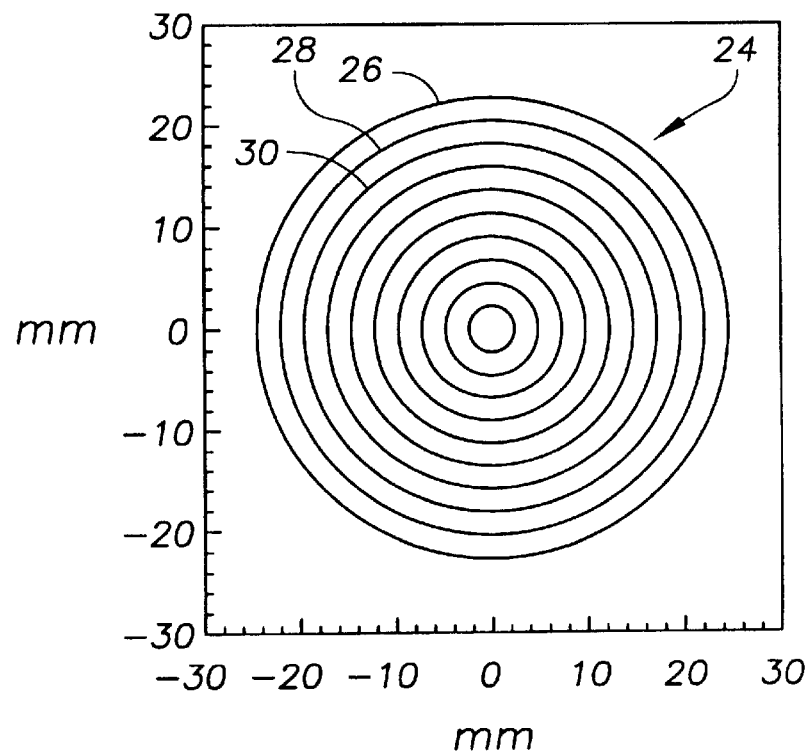
FIG. 5 is an end-sectional view of a cylindrical concentrator.
Figure 6:
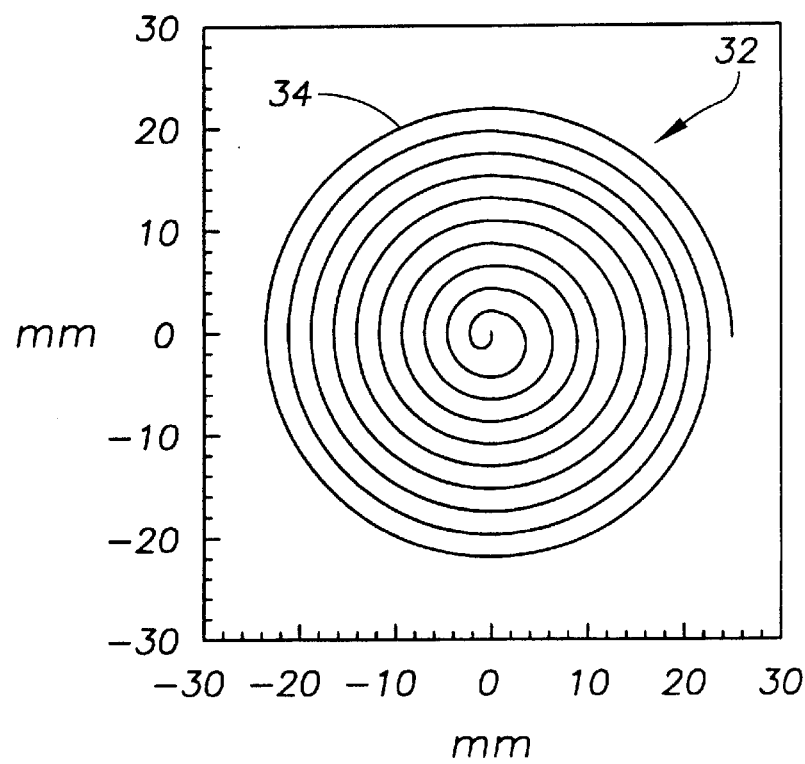
FIG. 6 is an end-sectional view of a spiral concentrator.

Two embodiments of the foil concentrators of the invention are shown in FIGS. 5 and 6. In FIG. 5, a cylindrical or conical concentrator 24 includes nested concentric cylinders or cones 26, 28, 30, etc. The concentric cylinders or cones are formed from a thin ribbon of a gold-coated plastic. The nested cylinders or cones 26, 28, 30, . . . , may also be made of glass, aluminum foil, silicon or germanium. A spiral concentrator 32 shown in FIG. 6 is formed of a long single ribbon 34 that is wound into a spiral. The ribbon 34 may be gold-coated plastic, aluminum foil or quartz ribbon. Suitable plastic materials for the embodiments in FIGS. 5 and 6 include polyester, polyimide, kapton, melinex, hostaphan, apilcal, mylar or any suitably smooth, flexible material. A particularly preferred plastic is available from the Eastman Kodak Company under the designation ESTAR™. Such plastic foil may range from 0.004 to 0.015 inches thick, for example. The plastic material is coated with a thin layer of metal, preferably a high Z metal such as nickel, gold or iridium and may be coated with multilayers. A suitable thickness for the metal coating is approximately 800 Å. Evaporation or sputtering is a suitable technology for applying the metal coating to the plastic ribbon material 34. The embodiments of FIGS. 5 and 6 may be configured for single reflection as illustrated in FIG. 1 or for multiple reflections as illustrated in FIG. 2.

The embodiments shown in FIGS. 5 and 6 both use a point-to-point geometry to obtain significant gain and solid angle in the energy band of 0.1 keV to 10 keV. The gain depends upon the x-ray reflectivity, focal distance, the width of the ribbon material and the number of windings of the spiral or the number of nested cylinders. The x-ray reflectivity of the concentrators 24 and 32 can be improved by depositing multilayers of W—C, Co—C, or Ni—C for example, on the uncoated or metal-coated plastic which allow the designs to include larger grazing angles.

Figure 7:
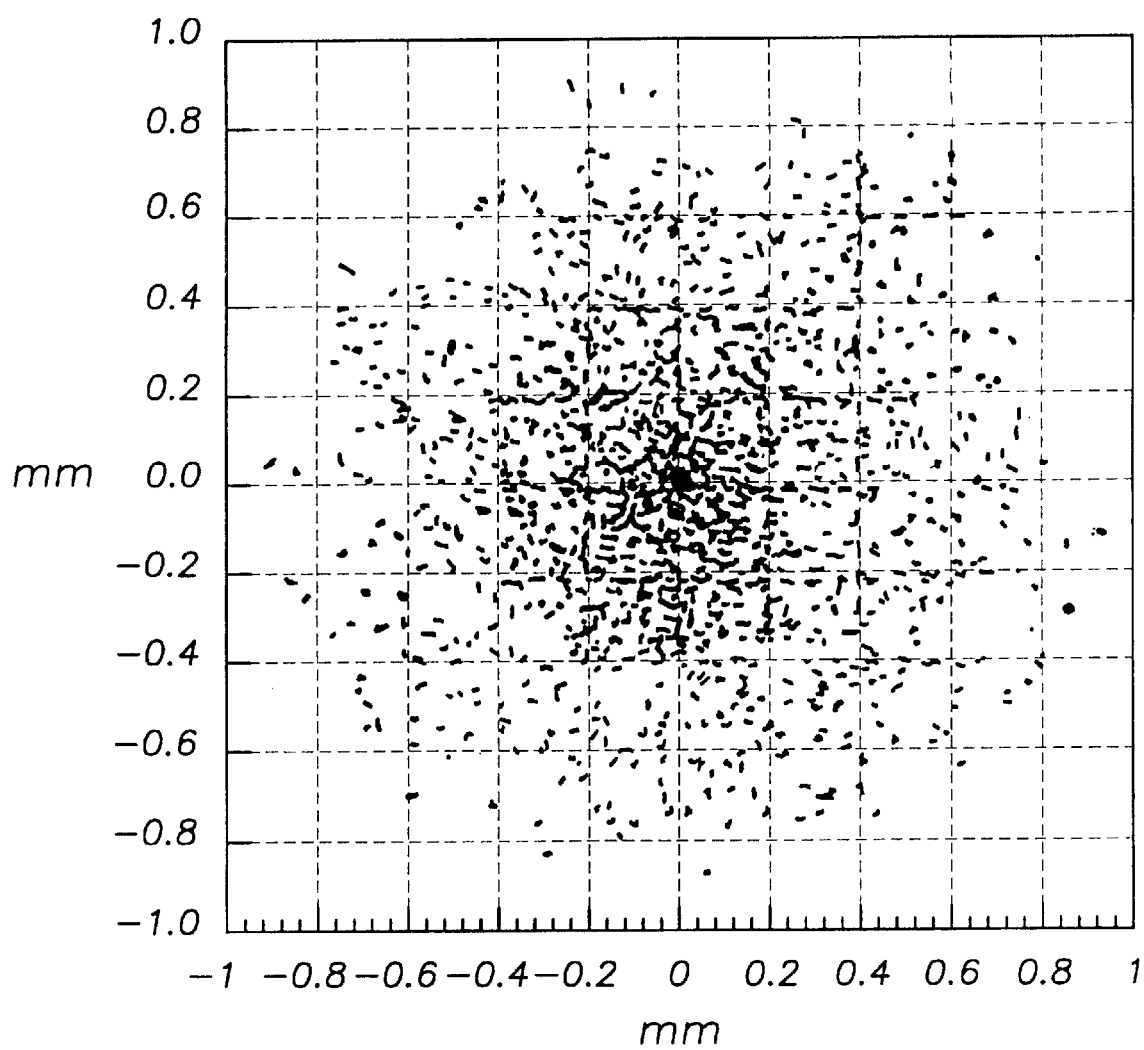
FIG. 7 is a graph showing a ray tracing simulation for a cylindrical concentrator.
Figure 8:
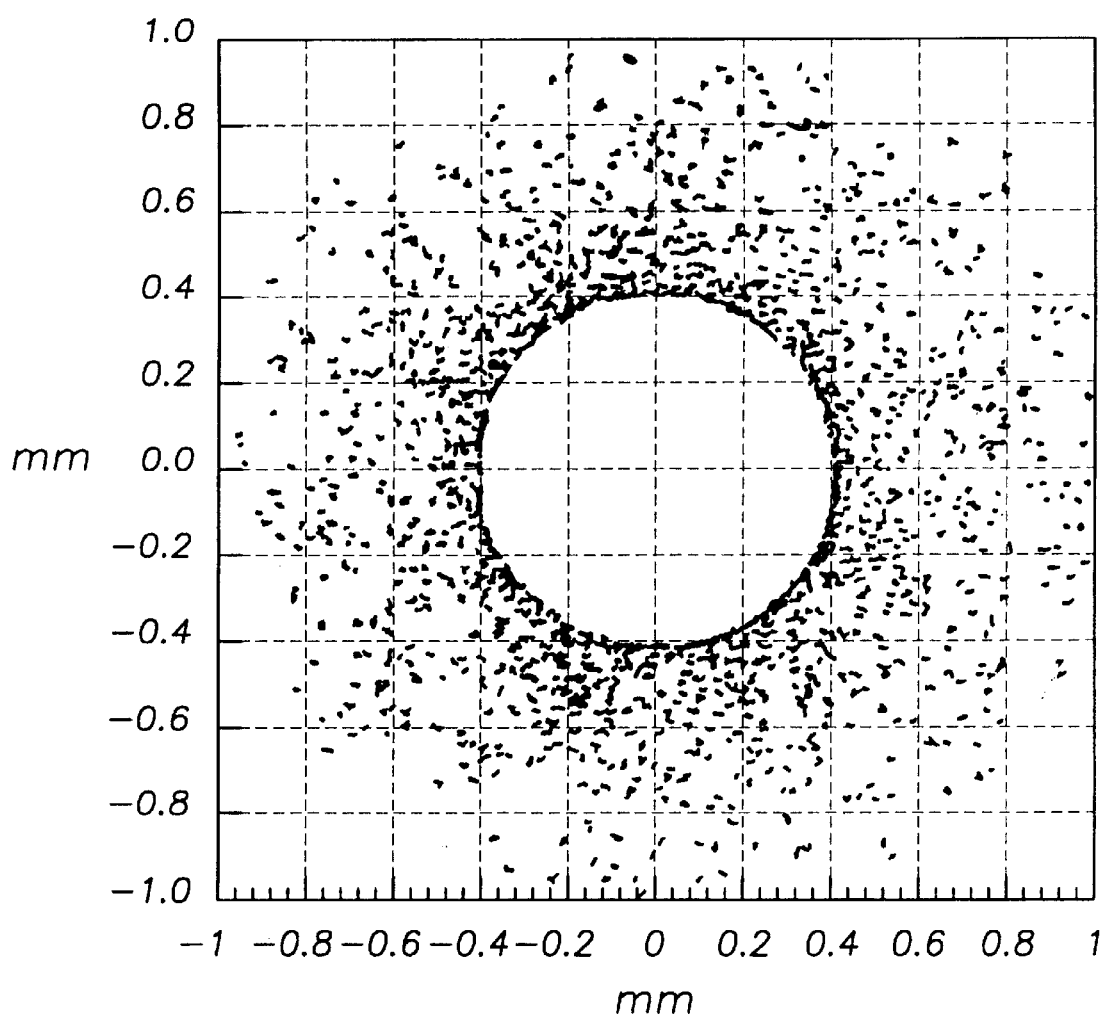
FIG. 8 is a graph showing a ray tracing simulation for a spiral concentrator.

An embodiment of the cylindrical spiral concentrator 32 has been built and tested in a microanalysis application at the Smithsonian Astrophysical Observatory in Cambridge, Massachusetts in which the distance between an x-ray source (scanning electron microscope, SEM) and an energy dispersive detector (lithium-drifted silicon detector and/or x-ray microcalorimeter) was approximately two meters. The constructed embodiment used single reflection in a point-to-point geometry. For the spiral concentrator 32 the ribbon was wound with a pitch of 0.05 inches and had 19 windings within an entrance aperture with diameter of 50 mm. For the cylindrical concentrator 24, the ribbon would be cut into 20 lengths to form concentric cylinders. FIG. 7 shows the results of a ray tracing computer program which simulated the shape of images produced by the cylindrical concentrator 24 with a ribbon width of 25 mm and focal length of 1.5 m. FIG. 8 depicts a simulated image expected from the cylindrical spiral concentrator 32.

Figure 9:
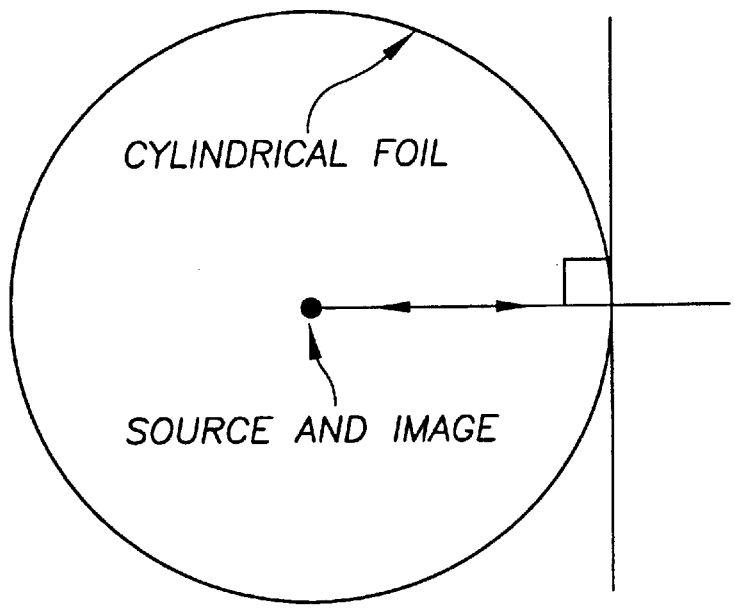
FIG. 9 is a projection of a trace of an x-ray reflected from a cylindrical foil telescope.
Figure 10:
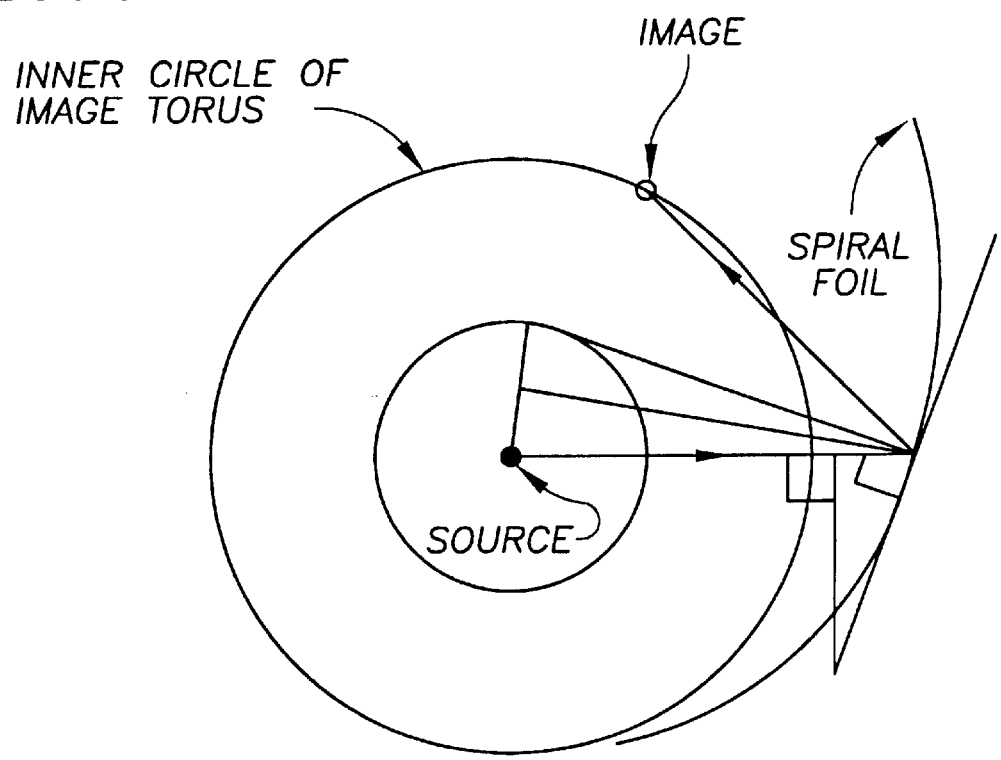
FIG. 10 is a projection of a trace of an x-ray reflected from a cylindrical spiral telescope.

In contrast to the cylindrical geometry, the spiral optic 32 forms an annular image as shown in FIG. 8 because the ray that connects the center of the spiral to the reflecting surface of the ribbon is not the same ray that describes the normal vector at the ribbon surface. This relationship is schematically illustrated in FIGS. 9 and 10 in which the reflection geometry of the cylindrical optics of FIG. 5 and the spiral optics of FIG. 6 are compared.

Figure 11:
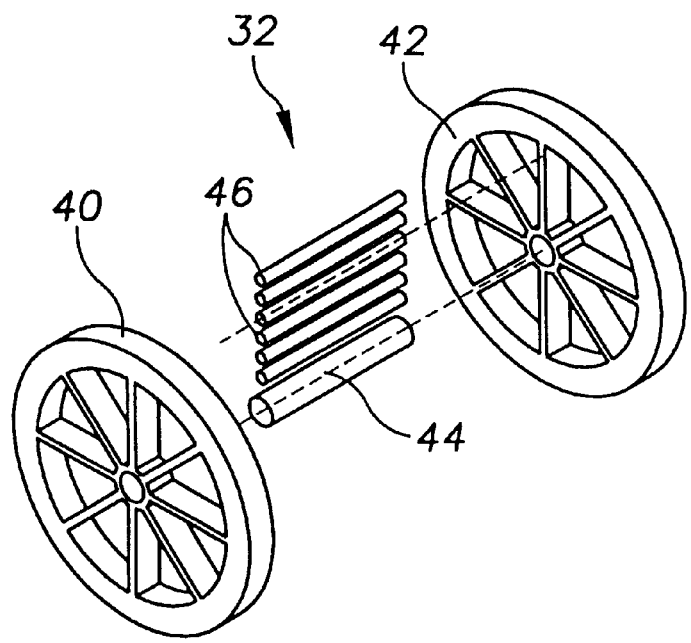
FIG. 11 is a perspective, cut-away view of structure supporting the ribbon components of a cylindrical or cylindrical spiral concentrator.
Figure 12:
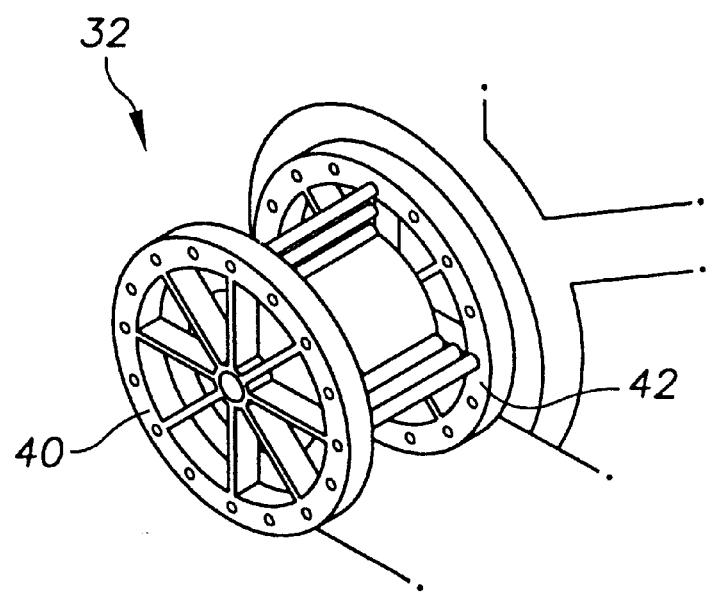
FIG. 12 is a perspective view of an assembled structure for a cylindrical or cylindrical spiral concentrator.

With reference to FIG. 11, the cylindrical spiral concentrator 32 comprises front and back discs 40 and 42 supported in spaced apart relation by a central hub 44. In this embodiment, each disc 40 and 42 has eight spokes which extend radially from the central hub 44. Holes (not shown) are drilled into the spokes to hold thin stainless steel pins 46. The pins 46 locate and support the gold-plated plastic ribbon 34 (not shown in FIG. 11). One end of the ribbon 34 is clamped to the central hub 44 and the other end is clamped to one of the outer ones of the support pins 46. FIG. 12 shows an assembled concentrator 32. It should be noted that the ribbon 34 may be supported by grooves machined into the radial spokes of the front and back discs 40 and 42. The structure supporting the ribbon 34 may be made of metal, plastic or a composite material. Suitable metals are aluminum, beryllium, stainless steel, titanium or tungsten.

The spiral optic 32 shown in FIG. 12 was evaluated in the context of an x-ray microanalysis application. The optic (or concentrator) 32 was mounted on a kinematic base which was attached to a stage with five degrees of freedom—three translational and two rotational axes. The stage was located midway (52 inches) between the axis of a scanning electron microscope and a microchannel plate detector or lithium-drifted silicon detector. These instruments were used to measure the image characteristics and spectral transmission properties, respectively.

Figure 13:
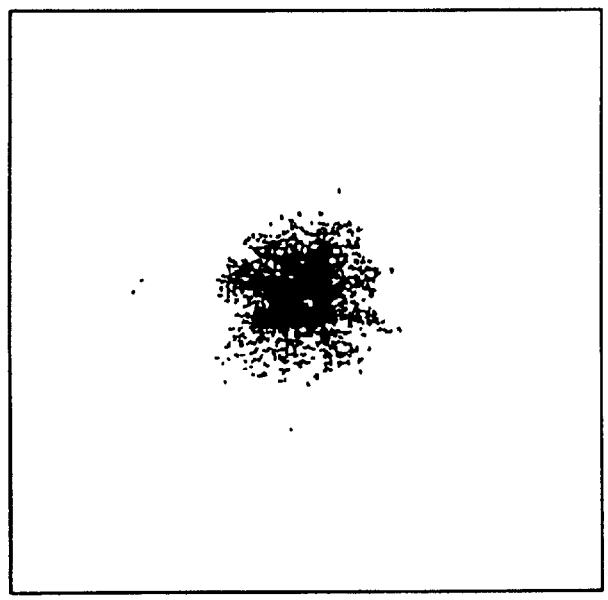
FIG. 13 is an image from an optic produced with AlKα x-rays at 1.49 keV.
Figure 14:
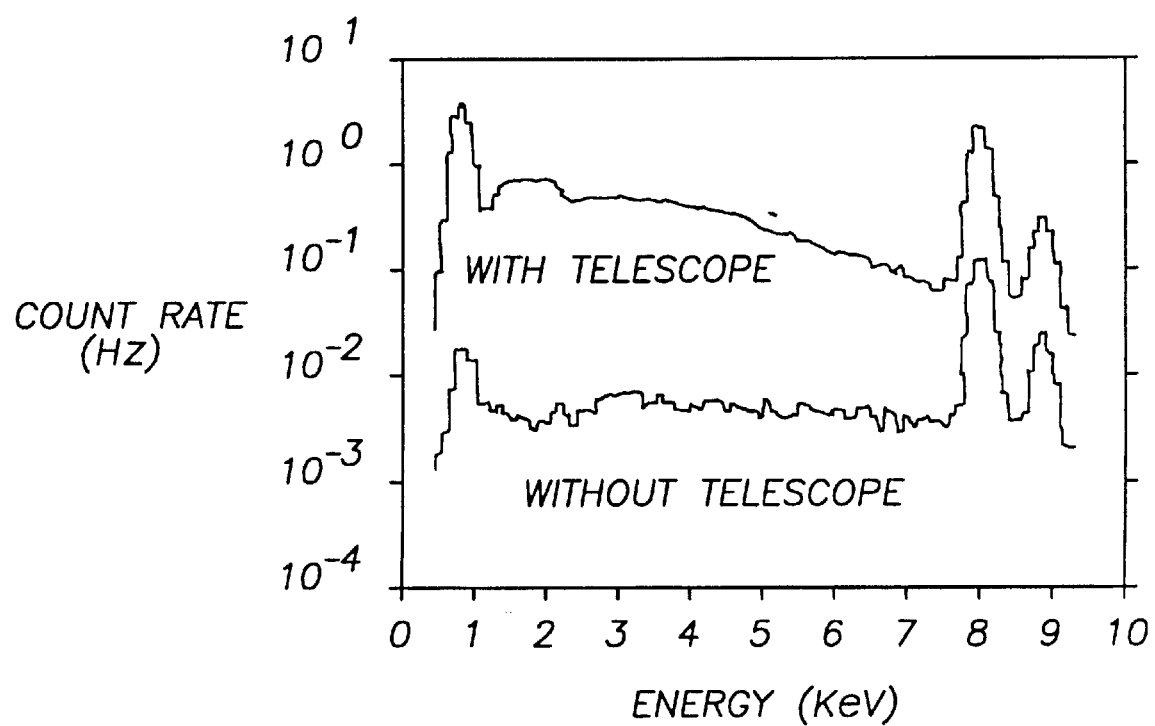
FIG. 14 is a graph of count rate versus energy with and without the telescope or concentrator of the invention.
Figure 15:
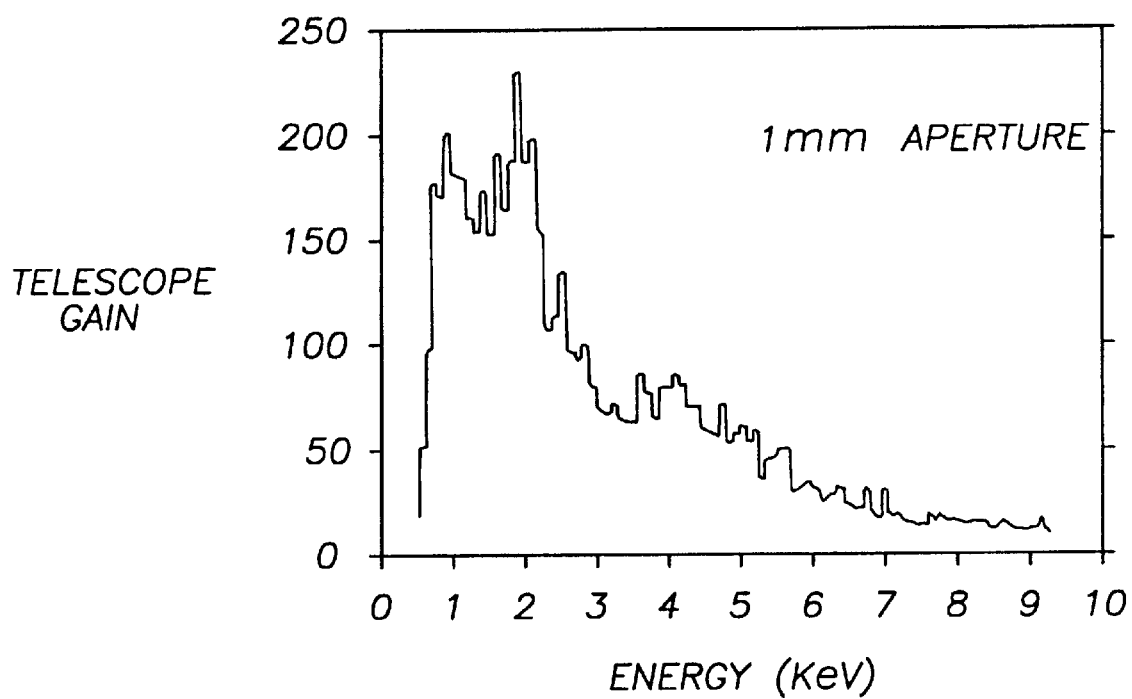
FIG. 15 is a graph of the ratio of intensities of the curves in FIG. 14.
Figure 16:
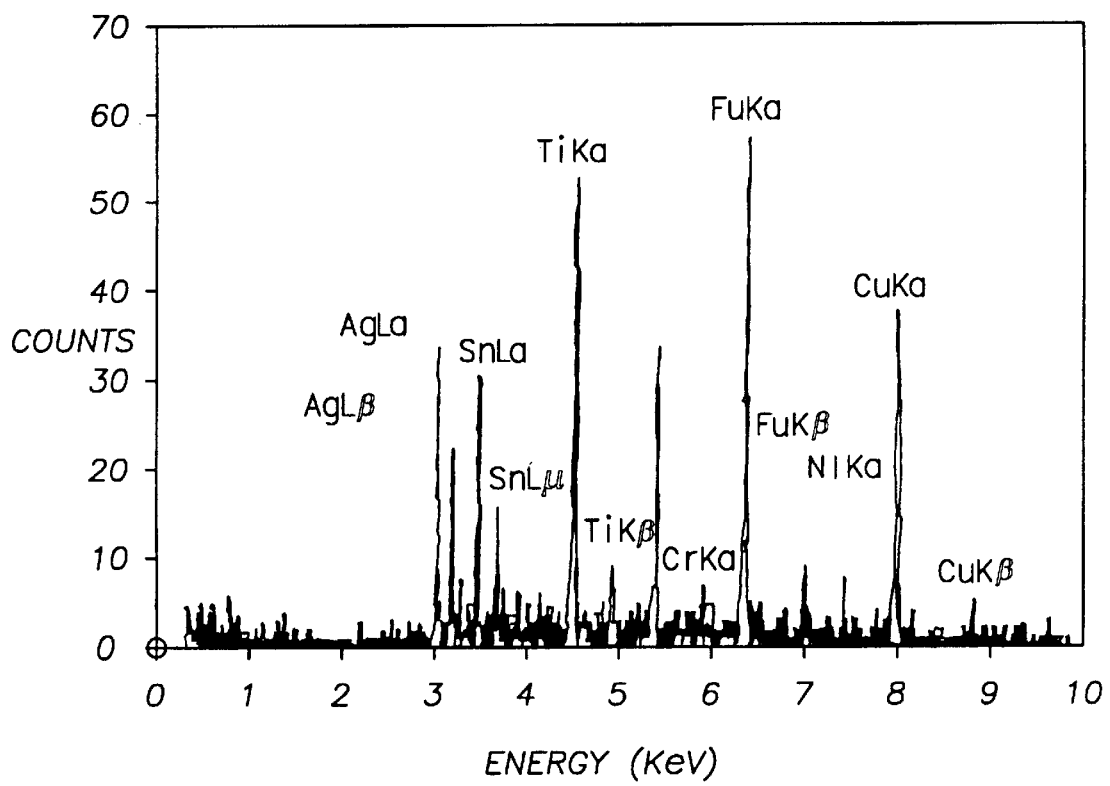
FIG. 16 is a microanalysis spectrum obtained from a scanning electron microscope using a spiral optic and a microcalorimeter.

FIG. 13 shows an image measured with an imaging detector at an energy of 1.5 keV. The annular image structure predicted by the simulation of FIG. 8 is evident. The spectral count rates obtained with and without the x-ray concentrator 32 are shown in FIG. 14. A lithium-drifted silicon detector was used for these measurements. The three peaks are Cu Lα at 930 eV, Cu Lα at 8.04 keV and Cu Lβ at 8.9 keV, respectively. The ratio of the intensities recorded with and without the telescope is a measure of the gain provided by the x-ray optic 32 and is shown in FIG. 15. In this particular case, a 1 mm diameter aperture was placed over the detector to mimic the size of a smaller x-ray detector such as a microcalorimeter. The gain of approximately 200 below 2 keV means that, at a distance of 2 meters from the source, the telescope can provide an x-ray intensity that is equivalent to placing the detector fourteen times closer to the source (14 cm). An example of a high resolution microanalysis spectrum taken with a cryogenic microcalorimeter instead of a lithium-drifted silicon detector is shown in FIG. 16.

Monolithic polycapillary glass optics have been adapted by others for many laboratory applications including microflorescence analysis and protein crystallography [references]. These tapered glass optics have made it possible to intercept x-rays from a point source over an angular range as much as 6 degrees and focus them to a spot with dimensions on the order of 0.2 mm FWHM.

Figure 17:
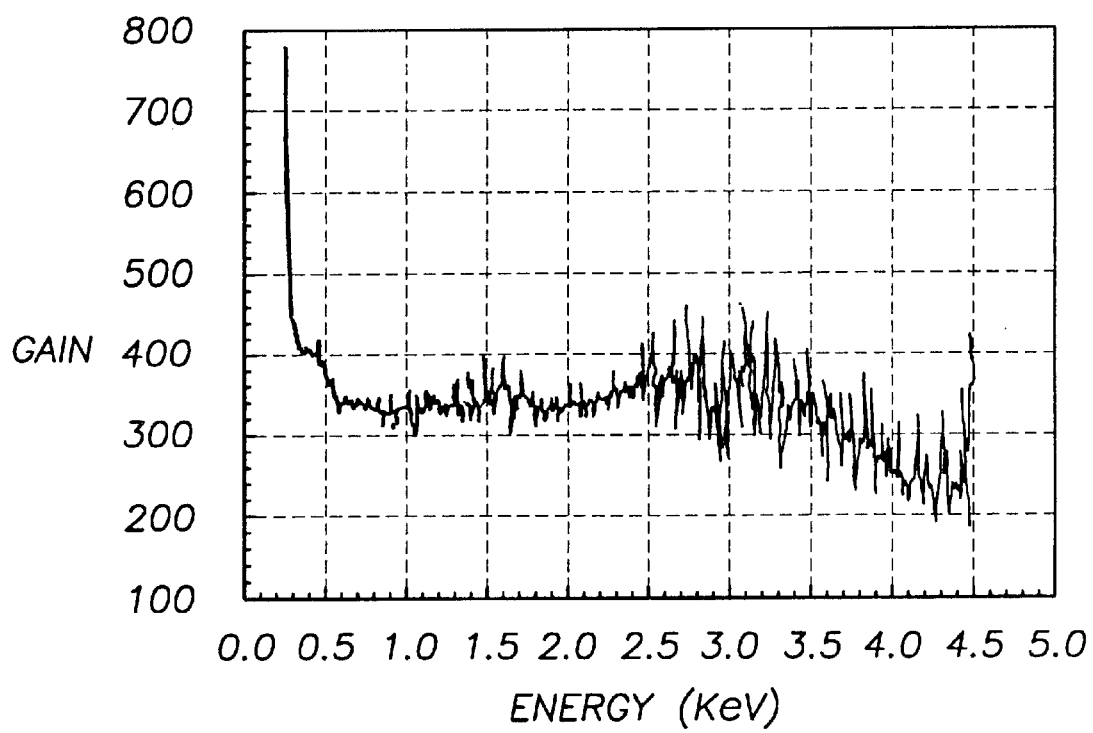
FIG. 17 is a graph of corrected gain versus energy using monolithic polycapillary glass optics.

These monolithic polycapillary glass optics may be used for microanalysis with an SEM and an energy dispersive detector such as a lithium-drifted silicon detector, germanium detector or a cryogenically cooled microcalorimeter. As depicted schematically in FIGS. 3 and 4, there are two ways to produce point-to-point focusing with capillary bundles. The first as shown in FIG. 3 is with a single monolithic polyeapillary bundle 20. We have tested such a capillary bundle with x-rays over an energy range extending to 6 keV. The optic used in this test had a point-to-point focal distance of 14 inches. The gain in intensity measured as a function of energy is as high as 400 as shown in FIG. 17.

Figure 18:
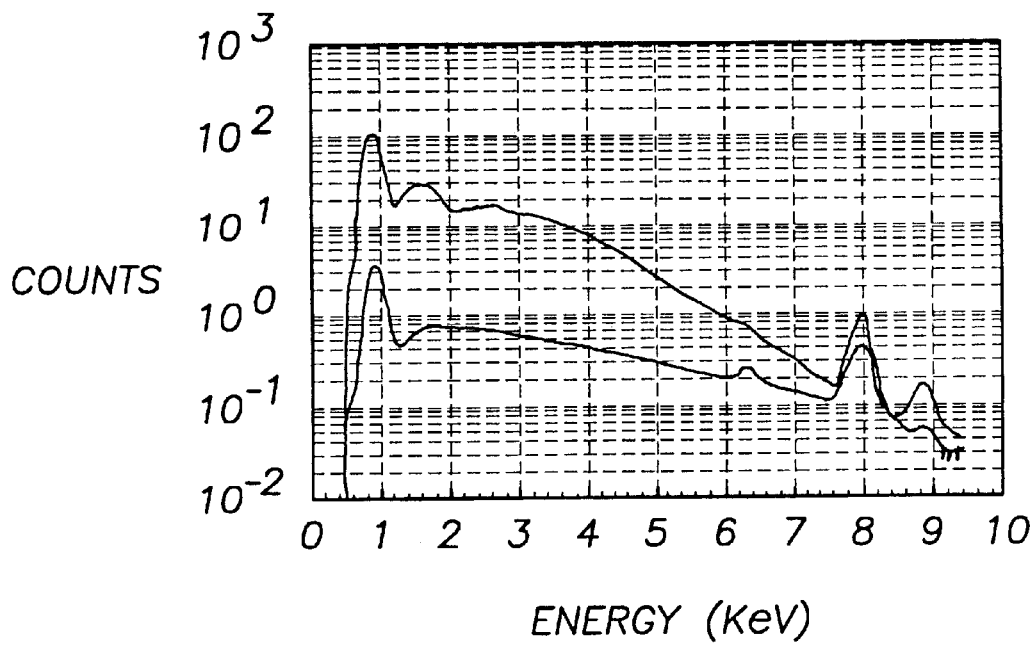
FIG. 18 is a graph of a spectrum utilizing monolithic point-to-parallel, parallel-to-point polycapillary glass optics.
Figure 19:
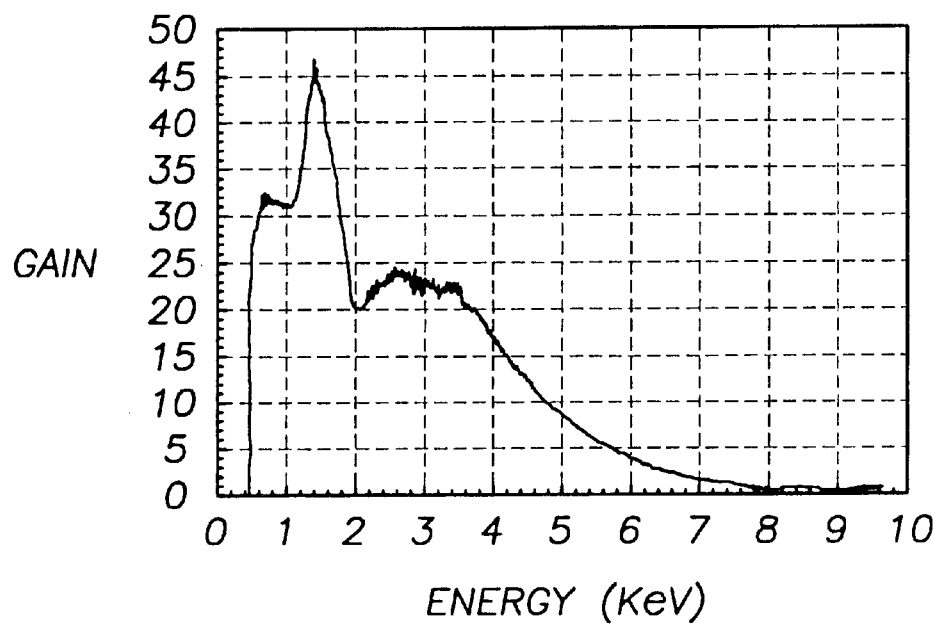
FIG. 19 is a graph of gain versus energy for monolithic point-to-parallel, parallel-to-point polycapillary glass optics.

The second method uses two monolithic polycapillary bundles 22 shown in FIG. 4. The input optic intercepts the x-rays from the point source 10 and directs the radiation 12 into a parallel bundle. The output lens portion intercepts the parallel portion of x-rays and refocuses them to a spot. This technique has the advantage that the distance between the source and the image is variable and does not require a specific monolithic polycapillary bundle to be manufactured each time an experimental configuration is modified. A spectrum from a polycapillary glass optics setup is shown in FIG. 18 and the gain as a function of energy is presented in FIG. 19.

The concentrators of the present invention may have application in the field of radiography, x-ray lithography and radiation therapy. For example, in conventional mammographic machines, a point source of Mo K x-rays forms a divergent beam that passes through the breast and is recorded on a photographic plate. Lesions in the breast tissue show up in the image as regions of contrasting intensity. Since the breast tissue is thick, the lesion can be located at varying distances along the beam path. The beam divergence will cause the recorded size of the lesion to vary according to its location along the beam path. This effect causes a loss of spacial resolution and can affect the resulting diagnosis of the mammogram. This effect would be absent if, instead of being divergent, the x-ray beam was parallel.

Figure 20:
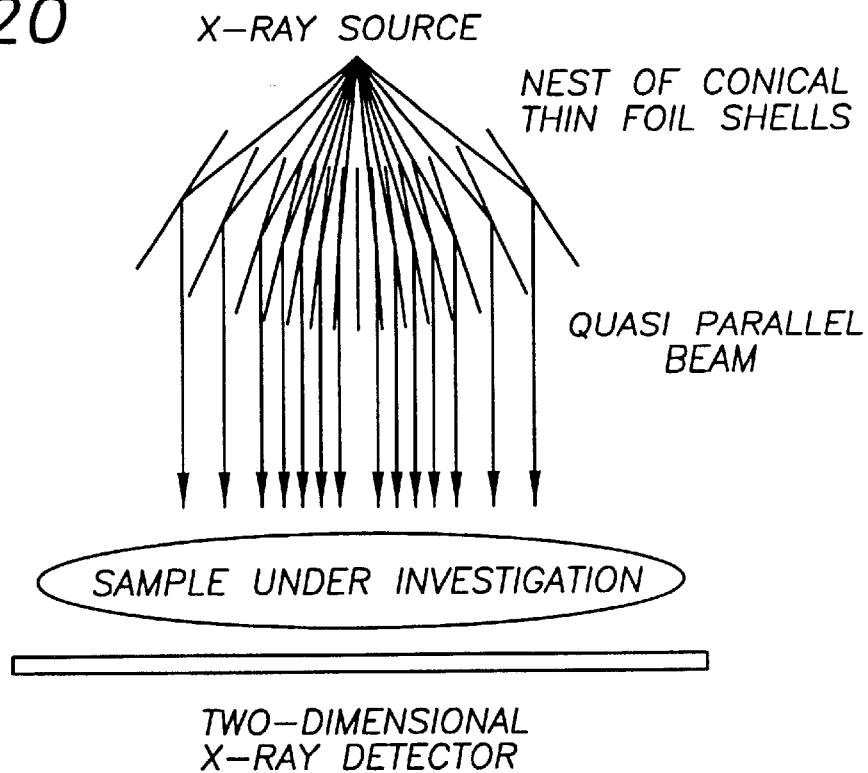
FIG. 20 is a schematic illustration of an application of the invention to x-ray mammography.

Large diameter parallel x-ray beams are not commonly available since most conventional x-ray sources are derived from point-like geometries. The solution to this problem is to introduce an optical system between the source and the breast that makes a parallel beam from the x-rays diverging from the point source. This can be accomplished either by a set of nested cones that have been multi-layered to reflect Mo K x-rays with high efficiency as shown in FIG. 20 or a point-to-parallel bundle of glass capillary tubes. Both are suitable approximations to a parabolic lens and will provide a quasiparallel beam with small angular divergence. Some angular divergence is required to allow the x-rays reflected from successive cones to overlap and remove any shadows of the cones. For this parallel beam, the image of a lesion will not be affected by its location along the beam path and a degree of uncertainty will be removed from the diagnosis.

Figure 21:
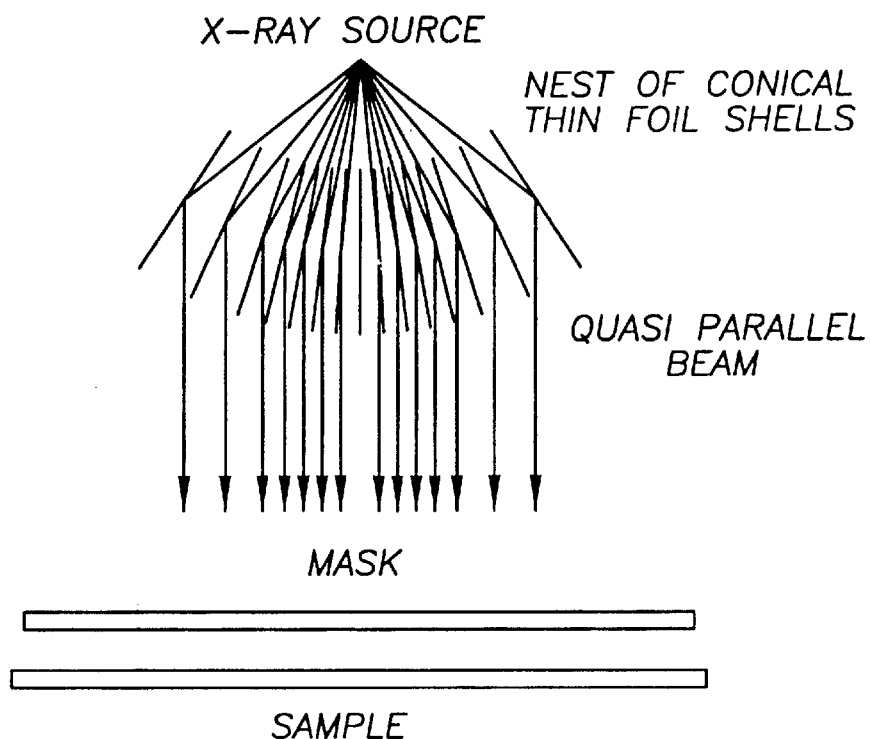
FIG. 21 is a schematic illustration of an application of the invention to x-ray lithography.

Similarly, as shown in FIG. 21, concentrators of the invention may form an optic for x-ray micro-lithography. Low energy x-rays are generally used for micro-lithography and multi-layering will not be necessary. A quasiparallel beam insures that the mask will be imaged with accuracy on a substrate. The lack of beam divergence means that it will be possible to construct features with thinner lines on the substrate.

Figure 22:
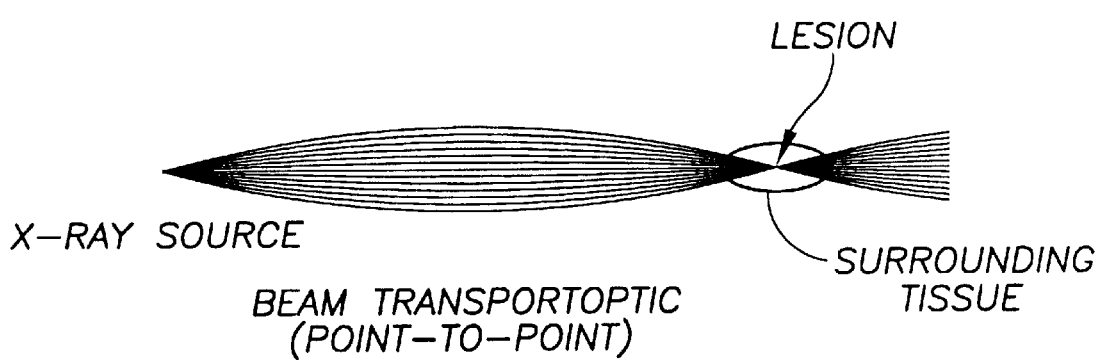
FIG. 22 is a schematic illustration of an application of the invention to x-ray radiation therapy.

For applications where x-ray therapy is required to destroy lesions located deep in tissue, the normal approach is to use a finely collimated beam that intersects the location of the lesion. This approach causes all the tissue along the line of sight to receive roughly the same high dose of radiation. One approach to provide lower doses to the surrounding tissue than for the lesion is to have the radiation enter the body within the volume of a cone whose apex is located at the lesion. This can be achieved mechanically by rotating the patient about the apex of the cone centered on the lesion. The pencil beam always goes through the apex, but with a variety of directions thus reducing the exposure to the healthy surrounding tissue. Another approach that achieves the same goal is to use an optic that will refocus a diverging beam from an x-ray source as shown in FIG. 22. The focal point of the optic is located at the lesion and the conical, refocusing beam will put maximum intensity on the lesion and much less on the healthy surrounding material. The optic can be made as an approximate point-to-point lens. The approximation can be in the form of nested cylinders or two opposed sets of nested cones. In either case, the mirrors are made from thin foils that have been multi-layered to reflect the x-rays of interest.

It is recognized that modifications and variations of the disclosed invention may be apparent to those skilled in the art and it is intended that all such modifications and variations be included within the scope of the appended claims.

What is claimed is:

1. X-ray concentrator comprising:
   a ribbon of material having a reflecting surface formed into a spiral having a plurality of windings.

2. X-ray concentrator comprising a plurality of nested, concentric cylinders of a ribbon material having a reflecting surface.

3. The concentrator of claims 1 or 2 further comprising a pair of spaced apart discs connected by a shaft, the discs including an outer ring supported by spokes; and means for supporting the reflecting surfaces.

4. The concentrator of claim 3, wherein the means for supporting the reflecting surfaces comprises stainless steel pins supported by the spokes.

5. The concentrator of claim 3, wherein the means for supporting the reflective surfaces comprises grooves in the spokes of the spaced apart discs.

6. The concentrator of claim 3, wherein the discs and shaft are made of metal.

7. The system of claim 6, wherein the metal is aluminum, beryllium, stainless steel, titanium or tungsten.

8. X-ray diagnostic system comprising:
   A scanning electron microscope which generates x-rays;
   An x-ray beam concentrator spaced away from the scanning electron microscope and disposed for receiving x-rays from the scanning electron microscope; and
   An x-ray spectrometer disposed for receiving x-rays from the concentrator, wherein the concentrator comprises a ribbon of material having a reflecting surface formed into a cylindrical spiral having a plurality windings, the ribbon of material being a metal-coated plastic.

9. X-ray diagnostic system comprising:
   a source of x-rays;
   an x-ray beam concentrator spaced apart from the x-ray source and disposed for receiving x-rays from the x-ray source; and
   an x-ray spectrometer disposed for receiving x-rays from the concentrator wherein the x-ray beam concentrator is a point-to-point single reflection cylindrical x-ray concentrator comprising two or more nested cylinders wherein the nested cylinders are made of plastic foil, the plastic foil comprising polyester, polyimide, kapton, melinex, hostaphan, apilcal, or mylar.

10. X-ray diagnostic system comprising:
    a source of x-rays:
    an x-ray beam concentrator spaced apart from the x-ray source and disposed for receiving x-rays from the x-ray source; and
    an x-ray spectrometer disposed for receiving x-rays from the concentrator wherein the concentrator is a point-to-point double or multiple reflection conical concentrator comprising two or more nested cones wherein the cones are made of plastic foil, the plastic foil comprising polyester, polyimide, kapton, melinex, hostaphan; apilcal, or mylar.

11. The system of claim 9 or 10 wherein the plastic is ESTAR™.

12. The system of claim 9 or 10 wherein the plastic foil has a thickness that ranges from 0.002 to 0.015 inches or any thickness that allows the foil to be bent into a cylinder.

13. X-ray diagnostic system comprising:
    a source of x-rays;
    an x-ray beam concentrator spaced apart from the x-ray source and disposed for receiving x-rays from the x-ray source; and
    an x-ray spectrometer disposed for receiving x-rays from the concentrator wherein the concentrator is a point-to-point single reflection cylindrical spiral concentrator.

14. X-ray diagnostic system comprising:
    a source of x-rays;
    an x-ray beam concentrator spaced apart from the x-ray source and disposed for receiving x-rays from the x-ray source; and
    an x-ray spectrometer disposed for receiving x-rays from the concentrator wherein the concentrator is a point-to-point double or multiple reflection conical spiral concentrator.

15. The system of claim 13 or 14 wherein the spiral is made of glass, plastic foil, aluminum foil, quartz ribbon, silicon or germanium.

16. The system of claim 15 wherein the plastic foil is polyester, polyimide, kapton, melinex, hostaphan, apilcal, or mylar.

17. The system of claim 15 wherein the plastic foil is ESTAR.

18. The system of claim 16 wherein the foil is 0.002 to 0.015 inches thick or any thickness that allows the foil to be bent into a spiral.

19. The system of claim 15 wherein the spiral is coated with thin layer of metal.

20. The system of claim 19 wherein the metal is a high Z metal.

21. The system of claim 20 wherein the high Z metal is nickel, gold or iridium.

22. The system of claim 15 wherein the spiral is coated with multi layers.

* * * * *